United States Patent [19]
Hack et al.

[11] Patent Number: 5,733,804
[45] Date of Patent: Mar. 31, 1998

[54] FABRICATING FULLY SELF-ALIGNED AMORPHOUS SILICON DEVICE

[75] Inventors: Michael G. Hack, Mountain View; René A. Lujan, Santa Clara, both of Calif.

[73] Assignee: Xerox Corporation, Stamford, Conn.

[21] Appl. No.: 577,634

[22] Filed: Dec. 22, 1995

[51] Int. Cl.[6] ................................................ H01L 21/84
[52] U.S. Cl. ........................ 438/158; 438/160; 438/949
[58] Field of Search ................................. 438/158, 160, 438/949

[56] References Cited

U.S. PATENT DOCUMENTS

| | | | |
|---|---|---|---|
| 5,242,530 | 9/1993 | Batey et al. | 156/613 |
| 5,274,250 | 12/1993 | Miyake et al. | 257/59 |
| 5,324,674 | 6/1994 | Possin et al. | 437/41 |
| 5,385,854 | 1/1995 | Batra et al. | 438/158 |
| 5,391,507 | 2/1995 | Kwasnick et al. | 437/41 |
| 5,396,072 | 3/1995 | Schiebel et al. | 250/370.09 |
| 5,441,905 | 8/1995 | Wu | 438/160 |
| 5,462,885 | 10/1995 | Nasu et al. | 437/40 |
| 5,466,620 | 11/1995 | Bang | 437/51 |
| 5,471,330 | 11/1984 | Sarma | 359/59 |
| 5,473,168 | 12/1995 | Kawai et al. | 257/61 |
| 5,486,939 | 1/1996 | Fulks | 359/74 |
| 5,491,347 | 2/1996 | Allen et al. | 257/59 |
| 5,597,474 | 1/1997 | Chen | 438/160 |

OTHER PUBLICATIONS

Kanichi, J., Hansan, E., Griffith, J., Takamori, T., and Tsang, J.C., "Properties of High Conductivity Phosphorous Doped Hydrogenated Microcystalline Silicon and Application in Thin Film Transistor Technology," *Mat. Res. Soc. Symp. Proc.*, vol. 149, 1989, pp. 239–246, month unknown.

Lustig, N., and Kanicki, J., "Gate dielectic and contact effects in hydrogenated amorphous silicon–silicon nitride thin film transistors," *J. Appl. Phys.*, vol. 65, May 1989, pp. 3951–3957.

Wu, I-W., Lewis, A.G., Huang, T.-Y., and Chiang, A., "Performance of Polysilicon TFT Digital Circuits Fabricated with Various Processing Techniques and Device Architectures," *SID 90 Digest*, 1990, pp. 307–310, month unknown.

Miura, Y., Jinnai, T., Kakkad, R., and Ibaraki, N., "A Five–Mask a Si TFT–Array Process with ITO–Metal Double–Layer Data–Lines and Poly–Si Source–Drains," *AM–LCD 95 Digest to Technical Papers*, Aug. 1995, pp. 75–78.

(List continued on next page.)

*Primary Examiner*—John Niebling
*Assistant Examiner*—Richard A. Booth

[57] ABSTRACT

An amorphous silicon thin film transistor (a-Si TFT) or other a-Si device is produced by depositing and lithographically patterning a layer of doped semiconductor material such as microcrystalline or polycrystalline silicon to produce a conductive lead. The semiconductor material is deposited over an insulating region and over an exposed part of an amorphous silicon layer. The insulating region has an edge that is over and approximately aligned with an edge of a gate region. The doped semiconductor layer therefore forms a junction to the amorphous silicon layer at the edge of the insulating region, approximately aligned with the edge of the gate region. Self-aligned lithographic patterning is performed in such a way that the conductive lead overlaps the insulating region by a distance that is no more than a maximum overlap distance. The maximum overlap distance can, for example, be no more than 1.0 μm, and can be 0.5 μm. The insulating region and the doped semiconductor layer can both be lithographically patterned by a combination of self-aligned backside exposure and top masked exposure. Overlap distance can be controlled by timing backside exposure, application of developer, baking, or application of etchant.

19 Claims, 10 Drawing Sheets

OTHER PUBLICATIONS

Tanaka, Y., Shibusawa, M., Dohjo, M., Tomita, O., Uchikoga, S., and Yamanaka, H., "A 13.8–in.–Diagonal High–Resolution Multicolor TFT–LCD for Workstations," *SID 92 DIGEST*, mAY 1992, PP. 43–46.

Souk, J.H., and Parsons, G.N., "Progress in Large Area Selective Silicon Deposition for TFT/LCD Applications," *Materials Research Society Symposium Proceedings*, vol. 345, 1994, pp. 47–52, month unknown.

U.S. Patent Application No. 08/235,008 entitled "Thin–Film Structure With Conductive Molybdenum–Chromium Line", filed on Apr. 28, 1994.

U.S. Patent Application No. 08/578,780 entitled "Array With Amorphous Silicon TFTS In Which Channel Leads Overlap Insulating Region No More Than Maxium Overlap", filed on Dec. 22, 1995.

1

FABRICATING FULLY SELF-ALIGNED AMORPHOUS SILICON DEVICE

BACKGROUND

The present invention relates to fabrication of circuitry on a substrate.

Kanicki, J., Hasan, E., Griffith, J., Takamori, T., and Tsang, J. C., "Properties of High Conductivity Phosphorous Doped Hydrogenated Microcrystalline Silicon and Application in Thin Film Transistor Technology," *Mat. Res. Soc. Symp. Proc.*, Vol. 149, 1989, pp. 239–246, describe techniques for phosphorous (P) doping of microcrystalline silicon. At pages 239 and 245, Kanicki et al. describe use of a heavily (n+) P-doped layer in a hydrogenated amorphous silicon (a-Si:H) thin film transistor (TFT) as a contact interlayer between a source/drain metal and a-Si:H layer. At pages 245 and 246, Kanicki et al. describe application of such a layer to a TFT structure, mentioning a gate to source-drain overlap of about 5 micron.

Lustig, N., and Kanicki, J., "Gate dielectric and contact effects in hydrogenated amorphous silicon—silicon nitride thin-film transistors," *J. Appl. Phys.*, Vol. 65, May 1989, pp. 3951–3957, describe improvement in TFT mobility upon replacement of phosphorous doped (n+) hydrogenated amorphous silicon (a-Si:H) by n+ hydrogenated microcrystalline silicon (μc-Si:H) in source-drain contact fabrication. Section II on pages 3951 and 3952 describes an experiment that included a thin n+μc-Si:H layer between source-drain metal and intrinsic a-Si:H, to insure ohmic contacts. The n+μc-Si:H was deposited from a PH$_3$/SiH$_4$ mixture in H$_2$ yielding an approximately 0.1-Ω cm material. The upper part of FIG. 1 shows a schematic cross section of a resulting transistor. Section III mentions that the devices had a width of 50 μm, a channel length of 20 or 40 μm, and a gate to source-drain overlap of approximately 5 μm, and that the TFTs are suitable for addressing flat panel LCD displays. As shown and described in relation to FIG. 5, average field-effect mobility increased with n+μc-Si:H.

Miura, Y., Jinnai, T., Kakkad, R., and Ibaraki, N., "A Five-Mask a-Si TFT-Array Process with ITO-Metal Double-Layer Data-Lines and Poly-Si Source-Drains," *AM-LCD 95 Digest of Technical Papers*, August 1995, pp. 75–78, describe a process to make completely self-aligned TFTs, illustrated in FIG. 7, with laser doping/crystallization of source-drain regions. As noted in relation to FIG. 3, contact resistance for ITO with a-Si is too high to give good TFT performance, while μC-Si(n) has much lower contact resistance and crystallized Si (poly-Si(n)) has an order of magnitude lower resistance than μC-Si(n); a contact resistance value of less than 0.5 Ω-cm$^2$ is generally required. Section B on page 77 describes back-side laser annealing using gate-metal as a mask to dope and crystallize source and drain regions. Source and drain regions were doped by diffusing phosphorous from a spin-on-glass layer deposited on top of an a-Si layer by exposing them to laser from the back-side, which also resulted in crystallization. The channel region remained undoped and amorphous, resulting in a self-aligned structure.

Nasu et al., U.S. Pat. No. 5,462,885, describe several techniques for manufacturing thin film transistors for liquid crystal displays. As shown and described in relation to FIGS. 40A–41D, one technique forms a gate electrode, a gate insulator film of SiN, an active layer of a-Si, and a channel protective film of SiN. A positive photoresist is applied and exposed with a photomask, and after development the channel protective film and active layer are etched to form the same pattern as the nonexposed photoresist. Then the remaining photoresist is again exposed, but with ultraviolet rays from the underside of the substrate, so that the gate electrode serves as a mask, so that, after development, the channel protective film is etched to have a pattern with almost the same width as the gate electrode. Then phosphorous is doped on both side portions of the active layer that are not covered by the channel protective film. An ITO film and a Cr film are formed and patterned by lithography techniques, leaving a drain electrode, a source electrode, a drain bus line, and a pixel electrode.

Wu, I-W., Lewis, A. G., Huang, T.-Y., and Chiang, A., "Performance of Polysilicon TFT Digital Circuits Fabricated with Various Processing Techniques and Device Architectures," *SID 90 Digest*, 1990, pp. 307–310, describe fabrication of top-gate and bottom-gate poly-Si devices in relation to FIG. 1. For the top-gate device, source-drain regions were doped by implanting boron or phosphorous through gate oxides, self-aligned to the gate electrode. For the bottom-gate device, channel silicon and gate dielectric films were deposited by LPCVD, and a self-aligned back-side exposure technique was used to etch the LPCVD SiO$_2$ film on top of the channel poly-Si film, prior to deposition of source/drain in-situ doped films. The top oxide film served as an etch stop for the source-drain delineation and also reduces gate to source-drain overlap capacitance.

SUMMARY OF THE INVENTION

The invention addresses problems in fabricating circuitry on a substrate.

Performance of an amorphous silicon (a-Si) device such as a thin film transistor (TFT) depends heavily on the relative lateral positions of the edges of the device's gated region and the boundaries or junctions between the device's doped channel leads and the undoped region that includes the device's channel. If the source-side boundary or junction is outside the edge of the gated region, contact resistance is poor; in the limit, the gate cannot control the state of the channel as required for proper device operation. On the other hand, if a device's gated region extends beyond the boundary or junction at either side of the channel and overlaps one or both doped channel leads, unnecessary excess geometric capacitance occurs; if the extent of overlap is not precisely controlled, capacitance will vary, producing intra-device variations between different devices formed on the same substrate.

Precise alignment of the edges of the gated region and the boundaries or junctions with the channel leads, referred to herein as "gate/lead alignment," would avoid these problems and would also make it possible to fabricate devices with shorter channel lengths, thus improving device performance. But precise gate/lead alignment is difficult to achieve.

The Miura et al. technique described above attempts to achieve precise gate/lead alignment by depositing an a-Si layer and a phosphorous layer over a metal gate region and by then performing backside laser crystallization. But the laser crystallization step is technically difficult and, since laser operations are not otherwise necessary for a-Si TFT production, use of a laser may require inefficient modifications in processes and equipment.

Another conventional technique attempts to achieve precise gate/lead alignment by depositing an a-Si layer over the gate region, by performing a backside exposure to produce a patterned dielectric layer that forms an insulating region self-aligned with the gated region, and by then implanting phosphorous ions, similar to the technique of Nasu et al.

described above. The insulating region prevents the phosphorous ions from entering the channel, but the phosphorous ions enter adjacent areas, forming heavily doped channel leads. Again, since implantation of phosphorous ions is not otherwise necessary for a-Si TFT production, use of phosphorous ion implantation may require inefficient modifications. Further, ion implantation can damage a TFT, and the resulting channel leads do not make good electrical contact with other layers as well as a doped deposited layer would. Also, a TFT produced in this manner is likely to have lower mobility.

The invention is further based on the discovery of an improved technique that solves the problem of precise gate/lead alignment. The technique achieves precise gate/lead alignment by depositing a doped semiconductor layer using plasma enhanced chemical vapor deposition (PECVD) to produce a self-aligned junction at an edge of a self-aligned insulating region. The technique then patterns the doped semiconductor layer using self-aligned lithography to produce a conductive lead that has a self-aligned edge overlapping the insulating region by a distance that is no more than a maximum overlap distance. The maximum overlap distance can, for example, be no more than 1.0 µm or can be 0.5 µm, permitting very small a-Si TFTs.

The technique can be implemented as an improvement on conventional techniques like those of Nasu et al. described above. The conventional techniques form an a-Si TFT that includes a gate region with first and second edges, an undoped a-Si layer over and extending beyond the edges of the gate region, and an insulating region over the a-Si layer but with edges approximately aligned with the gate region's edges. The improvement includes depositing a PECVD layer of doped semiconductor material, such as microcrystalline silicon (µxtal-Si) or polycrystalline silicon (poly-Si), over the insulating region and over parts of the a-Si layer outside the edges of the insulating region; this produces junctions at the edges of the insulating region and approximately aligned with the edges of the gate region. The improvement then patterns the doped semiconductor layer using self-aligned lithography in such a way that each of the channel leads has a self-aligned edge approximately aligned with one of the gate region's edges and each self-aligned edge overlaps the insulating region by a distance that is no more than the maximum overlap distance.

The doped semiconductor layer can be patterned with a self-aligned lithographic backside exposure in which the gate region prevents photoexposure of parts of a photoresist layer that are over it. Parts of the photoresist layer that are not photoexposed can then be removed to expose parts of the doped semiconductor layer. The exposed parts of the doped semiconductor layer can then be removed. A number of operations can be timed to control overlap, including backside exposure, application of developer, baking, and application of etchant.

The technique can also be implemented by producing a gate region in a patterned conductive layer and by then patterning subsequent layers using two self-aligned lithographic backside exposures. The first backside exposure, with positive resist, can be used to pattern an insulating layer to produce an insulating region with an edge approximately aligned with an edge of the gate region. The second backside exposure, with negative resist, is then used to pattern a PECVD layer of doped µxtal-Si as described above to produce a conductive lead extending from a junction approximately aligned with the edge of the gate region. The conductive lead has a self-aligned edge that overlaps the insulating region by a distance that is no more than the maximum overlap distance. A conductive metal electrode can be on the conductive lead, electrically connected to the junction through the conductive lead.

The technique therefore produces a junction that is fully self-aligned with the edge of the gate region and that is electrically connected to a conductive lead. The result is an inverted staggered device, because the gate is below the channel and on the opposite side of the a-Si layer from the channel leads.

The technique can be used to produce array circuitry in which each cell includes an a-Si TFT. The array circuitry could be used, for example, in producing a light valve array for an AMLCD.

The technique described above is advantageous because it can be used to produce a fully self-aligned a-Si TFT with minimal geometric capacitance between the gate and the channel leads and without reduced mobility. The technique is highly compatible with conventional techniques for producing a-Si TFTs, and does not require lasers, phosphorous implantation, or other complicated additional process steps or additional equipment.

The following description, the drawings, and the claims further set forth these and other aspects, objects, features, and advantages of the invention.

DETAILED DESCRIPTION

A. Conceptual Framework

Figure 1:
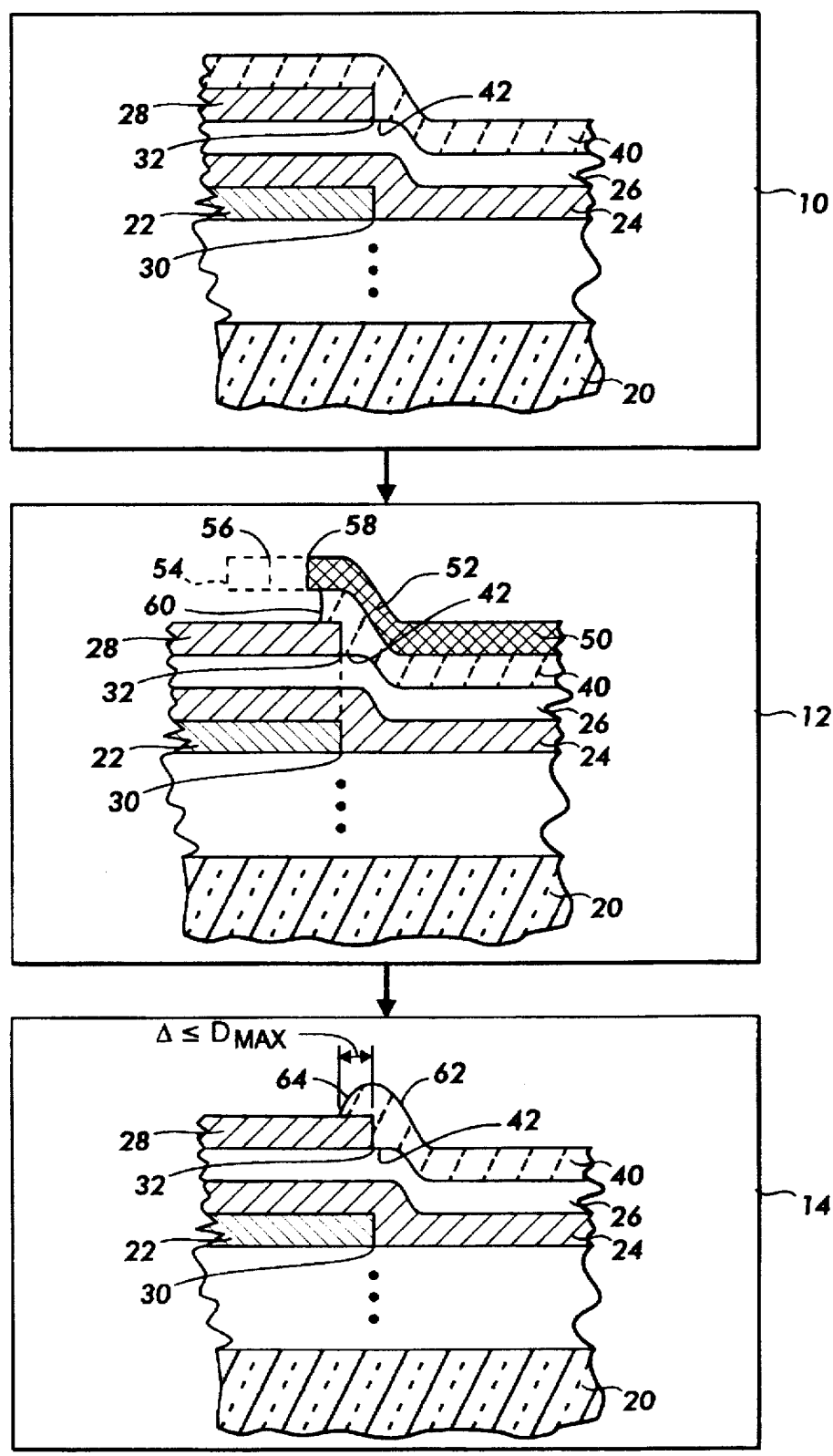
FIG. 1 is a flow diagram showing schematic cross sections of stages in which a doped semiconductor layer is deposited to produce a junction at a self-aligned edge of an insulating region and is then patterned using self-aligned lithography to produce a conductive lead extending from the junction and overlapping the insulating region by a distance that is no more than a maximum overlap distance.

The following conceptual framework is helpful in understanding the broad scope of the invention, and the terms defined below have the indicated meanings throughout this application, including the claims.

"Circuitry" or a "circuit" is any physical arrangement of matter that can respond to a first signal at one location or time by providing a second signal at another location or time, where the timing or content of the second signal includes information about timing or content of the first signal. Circuitry "transfers" a first signal when it receives the first signal at a first location and, in response, provides the second signal at a second location.

Any two components are "connected" when there is a combination of circuitry that can transfer signals from one of the components to the other. For example, two components are "connected" by any combination of connections between them that permits transfer of signals from one of the components to the other. Two components are "electrically connected" when there is a combination of circuitry that can transfer electric signals from one to the other. Two components could be electrically connected even though they are not in physical contact, such as through a combination of conductive components that are electrically connected between them.

An "electric circuit" is a circuit within which components are electrically connected. An "electric structure" is a physical structure that includes one or more electric circuits.

A "substrate" or "chip" is a unit of material that has a surface at which circuitry can be formed or mounted. An "insulating substrate" is a substrate through which no electric current can flow.

An "integrated circuit" is a circuit formed at a substrate's surface by batch processes such as deposition, lithography, etching, oxidation, diffusion, implantation, annealing, and so forth.

A "layer" is a thickness of material formed over a surface and extending generally parallel to the surface, with one side toward the surface and another side away from the surface. A layer may include two or more layers within it, referred to as "sublayers." A layer may be homogeneous or its composition may vary.

To "etch" is to remove parts of one or more layers of material.

An "etchant" is a fluid used to etch.

To perform "physical vapor deposition" is to cause a material to be deposited on a physical structure without a chemical reaction. Examples include sputtering, vacuum evaporation, and e-beam deposition.

To perform "chemical vapor deposition" is to cause a material to be deposited on a physical structure by use of reactant gases and an energy source to produce a gas-phase chemical reaction. The energy source could be thermal, optical, or plasma in nature; "plasma enhanced chemical vapor deposition" or "PECVD" uses a plasma energy source. A "PECVD layer" is a layer produced by PECVD.

An operation "deposits" a layer by depositing material to form the layer, such as by physical or chemical vapor deposition.

To perform "lithography" or to "lithographically pattern" is to use a radiation source to transfer a mask pattern to a layer of radiation-sensitive material and then to develop the radiation-sensitive material to obtain a positive or negative copy of the mask pattern. The radiation-sensitive material is referred to as "resist" or "photoresist." The process of transfering a mask pattern to a resist layer is referred to herein as "exposure," and parts of a resist layer that receive radiation during exposure are referred to herein as "photoexposed." A fluid used to develop a resist is referred to as a "developer." A "positive resist" is a resist for which a developer can remove photoexposed parts much more quickly than parts that are not photoexposed. A "negative resist" is a resist for which a developer can remove parts that are not photoexposed much more quickly than photoexposed parts. If it is to be used for etching, a pattern of resist that results from development may be referred to as a "pattern of mask material" or simply a "mask."

In lithography, "backside exposure" is exposure of a resist layer in a structure on a substrate, where radiation reaches the resist layer through the substrate. A part of a layer between the resist layer and the substrate can provide a mask pattern if it prevents radiation from reaching the resist layer in areas over it.

An operation "forms" a patterned layer or circuitry in a layer by performing lithography to produce a pattern of mask material and then etching away either the part of the layer that is not covered by the pattern or the part that is covered.

A "thin-film structure" is an electric structure that is formed at a surface of an insulating substrate. A thin-film structure could be formed, for example, by deposition and patterned etching of films on the insulating substrate's surface.

A "lead" is a part of a component at which the component is electrically connected to other components. A "line" is a simple component that extends between and electrically connects two or more leads. A line is "connected between" the components or leads it electrically connects. A lead of a component is "connected" to a lead of another component when the two leads are electrically connected, such as by a combination of leads and lines. In an integrated circuit, leads of two components may also be "connected" by being formed as a single lead that is part of both components.

The terms "array" and "cell" are related: An "array" is an article of manufacture that includes an arrangement of "cells." For example, a "two-dimensional array" or "2D array" includes an arrangement of cells in two dimensions. A 2D array of circuitry may include rows and columns, with a line for each row and a line for each column. Lines in one direction may be "data lines" through which a cell receives or provides signals that determine or indicate its state. Lines in the other direction may be "scan lines" through which a cell receives a signal enabling it to receive signals from or provide signals to its data line.

In an array of circuitry, "cell circuitry" is circuitry connected to a cell's scan line and data line.

In a thin film structure, the terms "gate region," "gated region," and "channel" have related meanings: A "gate region," sometimes called a "gate," is a part of a layer that controls conductivity of a "gated region" that is part of another layer, typically defined by the projection of the gate region onto the other layer; conversely, a "gated region" is a part of a layer with conductivity that changes depending on the gate region; a "channel" is formed when current flows through a gated region. A channel is "highly conductive" or "ON" when the channel is in a state in which current can flow freely through it. A channel is "OFF" when the channel is in a state in which very little current can flow through it.

A "channel lead" is a lead that electrically connects to a channel. A channel may, for example, extend between two channel leads.

A "charge carrier" is a real or fictitious particle that can transport charge to produce a current; electrons and holes are examples of charge carriers. A "charge carrier source" is an ion, atom, molecule, or other feature that can provide a charge carrier. A "charge carrier destination" is an ion, atom, molecule, or other feature that can neutralize or stop movement of a charge carrier. In an integrated circuit, an "n-channel" is a channel for which the majority of charge carrier sources provide charge carriers of negative sign such as electrons; a "p-channel" is a channel for which the majority of charge carrier sources provide charge carriers of positive sign such as holes.

A "dopant particle" or "dopant" is an ion, atom, molecule, or other particle that can be added to a channel or other part of an integrated circuit during fabrication and that serves as a charge carrier source when the integrated circuit is in use. An "n-type dopant" provides charge carriers of negative sign and a "p-type dopant" provides charge carriers of positive sign.

A layer or part of a layer is "doped" if it contains dopant and "undoped" if it does not.

A "transition" or "junction" occurs where a doped channel lead meets an undoped layer of material that includes a gated region. The channel lead "extends away from" the transition or junction.

A "transistor" is a component that has a channel or a series of channels that extends between two channel leads, and that also has a third lead—referred to as a "gate lead" or simply "gate"—such that the channel or series of channels can be switched between ON and OFF by signals that change potential difference between the gate and one of the channel leads, referred to as the "source." The channel lead that is not the source is referred to as the "drain." Other components may have leads called gates, sources, and drains by analogy to transistors.

Signals on a line "control conductivity" of a channel if the signals can change conductivity of the channel. Such a line may be called a "gate line" and the signals may be called "gate signals." In an array in which the gates of transistors that control a row of elements are connected to such a line, it is more common to call the line a "scan line" and the signals "scan signals."

Two components are electrically connected "under control of" a line if a signal on the line can change conductivity of a third component connected between the two components so that the two components are electrically connected. For example, circuitry that includes a channel or series of channels can electrically connect two components under control of a line that is electrically connected to one or more gate regions that control conductivity of the channel or series of channels.

In a thin-film structure at a surface, a part of a first layer "covers" or "has a shape that covers" or "is over" a part of a second layer if the part of the second layer is between the part of the first layer and the surface.

An "insulating layer" is a layer formed of a non-conductive material.

A part of a layer "has an edge" if another, complementary part of the layer has been removed by one or more processes, leaving the part of the layer.

The edge is the boundary between part of a layer and its complementary part.

A part of a layer is "exposed" when it is not covered by any other layer. For example, it may be exposed as a result of one or more processes that removed another layer from over it. Such processes can be said to "expose" the part.

A part of a first layer "overlaps" a part of a second layer if the part of the first layer is over and extends beyond an edge of the part of the second layer, but has an edge inside the edge of the part of the second layer. The "overlap distance" or "distance" by which the first layer overlaps the second layer is the maximum distance from the edge of the second layer inward to the edge of the first layer. A "maximum overlap distance" is an overlap distance that cannot be exceeded. For example, it may not be possible to reliably fabricate a device or a device may not function properly if a maximum overlap distance is exceeded.

An operation "controls" an overlap distance if the operation is one of a set of one or more operations that determine the size of the overlap distance.

Edges of two layers or parts of layers in a structure formed on a substrate are "approximately aligned" if their projections onto the surface of the substrate at which the structure is formed are approximately the same.

Edges of two layers or parts of layers are "self-aligned" if they are approximately aligned because one was produced by a lithographic process in which the other served as a mask. Accordingly, "self-aligned lithography" or "self-aligned lithographic patterning" is lithography that obtains approximate alignment between edges of two layers or parts of layers by using one layer as a mask in a process that patterns the other. In self-aligned lithography, "self-aligned backside exposure" is backside exposure in which part of a blocking layer between the resist layer and the substrate prevents radiation from reaching the resist layer so that the resulting exposure pattern in the resist layer can then be used to lithographically pattern a layer between the blocking layer and the resist layer.

A "thin film transistor" or "TFT" is a transistor that is part of a thin-film structure.

An "amorphous silicon thin film transistor" or "a-Si TFT" is a TFT with a gated region that is part of a layer of amorphous silicon, so that the TFT's channel is formed in amorphous silicon.

B. General Features

Figure 2:
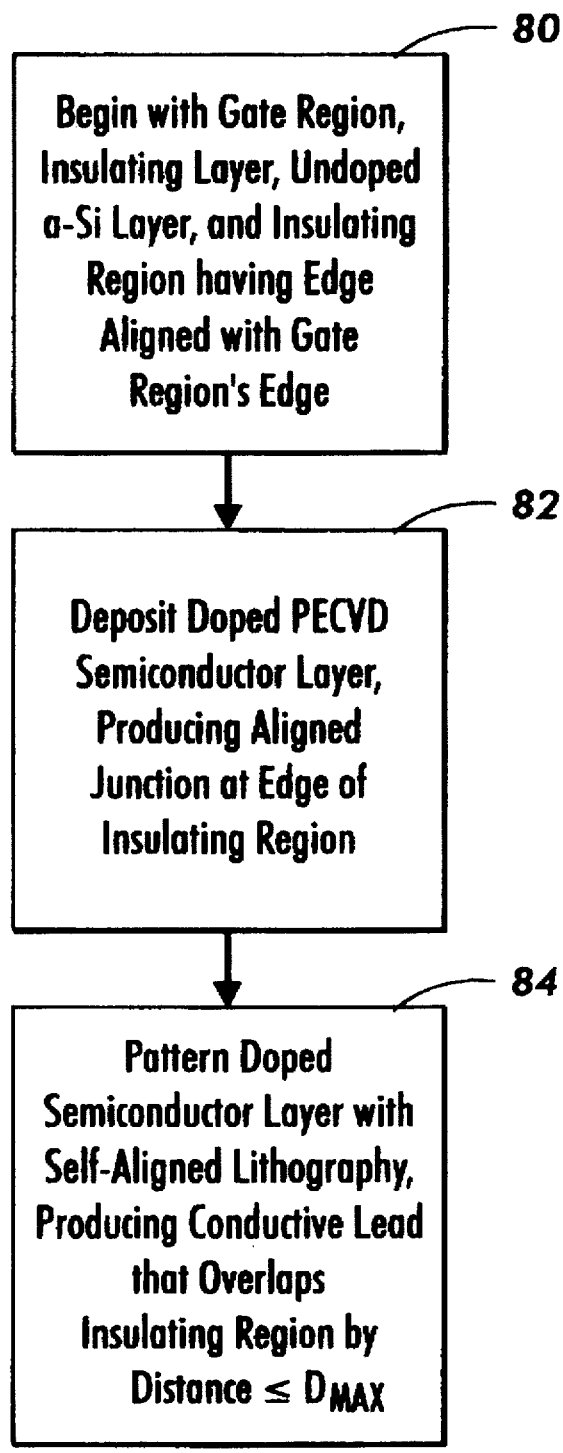
FIG. 2 is a flow chart showing acts in producing a junction and a conductive lead as in FIG. 1.

FIGS. 1–6 show general features of the invention. FIG. 1 shows stages that produce a junction at a self-aligned edge of an insulating region and a conductive lead extending from the junction and overlapping the insulating region by a distance that is no more than a maximum overlap distance. FIG. 2 shows general acts in producing a junction and conductive lead as in FIG. 1. FIGS. 3–6 show how backside exposure, application of developer, baking, and application of etchant, respectively, can each be timed to control overlap distance.

In each of cross sections 10, 12, and 14 in FIG. 1, circuitry being formed at a surface of substrate 20 includes gate region 22, first insulating layer 24, undoped a-Si layer 26, and insulating region 28. Layers 24 and 26 extend over edge 30 of gate region 22, but edge 32 of insulating region 28 is approximately aligned with edge 30 of gate region 22, as would be the case for a self-aligned insulating region.

Cross section 10 in FIG. 1 also shows doped semiconductor layer 40. Prior to PECVD deposition of doped semiconductor layer 40, undoped a-Si layer 26 has an exposed part outside edge 32 of insulating region 28. Doped semiconductor layer 40 lies over insulating region 28 and over the exposed part of a-Si layer 26. PECVD deposition of doped semiconductor layer 40 therefore produces junction 42 at edge 32 of insulating region 28. Junction 42 is approximately aligned with edge 30 of gate region 22, as suggested by the dashed line in cross section 12.

Cross section 12 shows self-aligned lithographic patterning of doped semiconductor layer 40. Part 52 of resist layer 50 remains after other parts are removed, such as through exposure, development, and baking. Edge 54 illustratively indicates extent of exposure, edge 56 indicates the distance by which resist layer 50 overlaps insulating region 28 after development, and edge 58 indicates overlap after baking. Self-aligned edge 60, approximately aligned with edge 30 of gate region 22, indicates the distance by which doped semiconductor layer 40 overlaps insulating region 28 after other parts of doped semiconductor layer 40 are removed, such as through etching.

Cross section 14 shows the structure after lithographic patterning. Conductive lead 62 is formed in doped semiconductor layer 40, with overlap 64 extending beyond edge 32 of insulating region 28 after completion of lithographic patterning, such as by removal of photoresist layer 50. As shown in FIG. 1, the distance $\Delta$ by which the self-aligned edge of conductive lead 62 overlaps insulating region 28 at any point along edge 32 is less than $D_{MAX}$, a maximum value appropriate to the structure being produced. In general, $D_{MAX}$ can be kept sufficiently small to prevent shorting across insulating region 28 and to keep capacitance between conductive lead 62 and gate region 22 below the maximum capacitance allowable for proper operation of the structure. For example, for a-Si TFTs with channel lengths of approximately 5 µm, it may be necessary to have $D_{MAX} \leq 1.0$ µm to minimize capacitance and maintain performance of the device; even lower values of $D_{MAX}$ may help to avoid problems due to small variations in capacitance.

The general acts in FIG. 2 begin in box 80 with a structure that includes a gate region, an insulating layer and an undoped a-Si layer over the gate region, and an insulating region over the gate region in a layer over the a-Si layer. The insulating region has an edge approximately aligned with the gate region's edge, like edge 32 of insulating region 28 in FIG. 1, approximately aligned with edge 30 of gate region 22. As a result, the a-Si layer has an exposed part outside the edge of the insulating region, like layer 26 in FIG. 1.

The act in box 82 deposits a doped PECVD layer of semiconductor material, such as layer 40 in FIG. 1, over the insulating region and over exposed parts of the a-Si layer. The act in box 82 produces a junction, such as junction 42, between the doped semiconductor layer and the a-Si layer at the edge of the insulating region. Because the edge of the insulating region is approximately aligned with the edge of the gate region, the junction is also approximately aligned with the edge of the gate region.

The act in box 84 then patterns the doped semiconductor layer using self-aligned lithography to produce a conductive lead extending from the junction, like lead 62 in FIG. 1. The act in box 84 is performed in such a way that the conductive lead has a self-aligned edge approximately aligned with the edge of the gate region but overlapping the insulating region by a distance that is no more than a maximum overlap distance, $D_{MAX}$.

FIGS. 3–6 illustrate ways in which overlap distance can be controlled in the act in box 84. Each shows an enlarged detail of the region around overlap 64, with parts of layers having the same reference numerals as in cross section 12 in FIG. 1.

Figure 3:
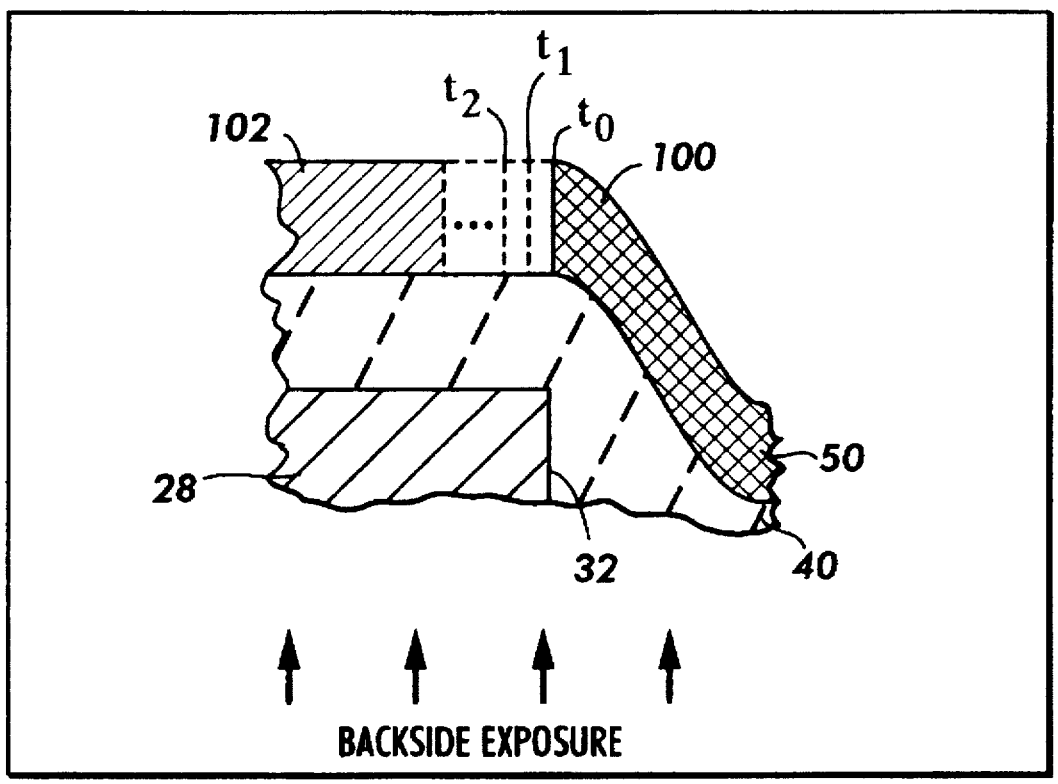
FIG. 3 is a schematic cross section showing how a backside exposure can be timed to control the distance by which a conductive lead as in FIG. 1 overlaps an insulating region.

In FIG. 3, resist layer 50 is a layer of photoresist, and backside exposure is performed to photoexpose parts of resist layer 50 that are not over gated region 22. Gated region 22 initially prevents photoexposure of resist layer 50 in areas over it, but scattering of light gradually exposes more and more of resist layer 50 near edge 32 of insulating region 28. Therefore, backside exposure of resist layer 50 can be timed to control overlap. At time $t_0$, the boundary between photoexposed part 100 and non-photoexposed part 102 is approximately aligned with edge 32, because the backside exposure has full effect where it is not blocked by gate region 22. As the duration of backside exposure increases to $t_1$ and $t_2$, however, photoexposed part 100 extends further and further past edge 32 of insulating region 28 due to light scattering. Eventually, photoexposed part 100 could extend so far that the extent of overlap after subsequent processes would exceed $D_{MAX}$, but a duration of backside exposure below that limit can produce an appropriate overlap distance by preventing removal of doped semiconductor layer 40 above edge 32.

Figure 4:
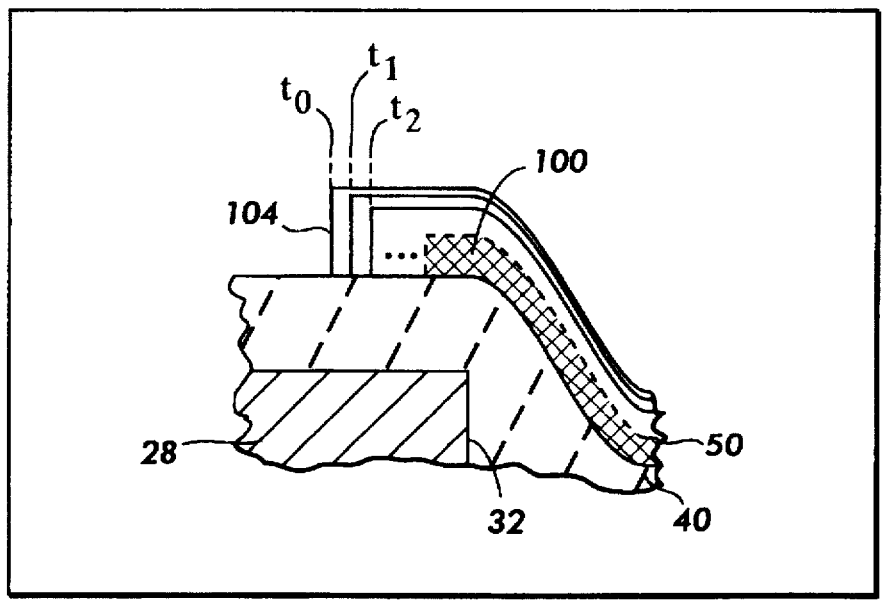
FIG. 4 is a schematic cross section showing how application of developer can be timed to control the distance by which a conductive lead as in FIG. 1 overlaps an insulating region.

In FIG. 4, resist layer 50 is being developed, removing non-photoexposed part 102 and leaving photoexposed part 100. The developer quickly removes non-photoexposed part 102, but also removes photoexposed part 100 at a slower rate. Therefore, development of resist layer 50 can be timed to control overlap. At time $t_0$, photoexposed part 100 extends to edge 104, the boundary between photoexposed part 100 and non-photoexposed part 102, but all of non-photoexposed part 102 has been removed. As the duration of development increases to $t_1$ and $t_2$, however, the developer reduces the size of photoexposed part 100. Eventually, photoexposed part 100 could be reduced so much that there would be no overlap after subsequent processes, but a duration of development below that limit can produce an appropriate overlap distance.

Figure 5:
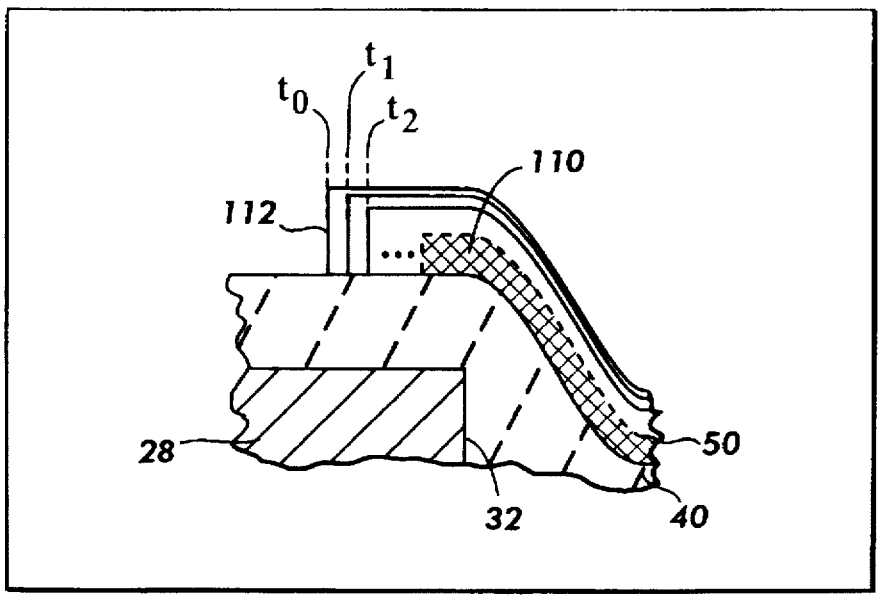
FIG. 5 is a schematic cross section showing how baking can be timed to control the distance by which a conductive lead as in FIG. 1 overlaps an insulating region.

In FIG. 5, resist layer 50 is being baked, which slowly shrinks remaining part 110. Therefore, baking of resist layer 50 can be timed to control overlap. At time to, remaining part 110 extends to edge 112, its extent after development. As the duration of baking increases to $t_1$ and $t_2$, however, the size of remaining part 110 shrinks. An appropriate duration of baking can produce an appropriate overlap distance.

Figure 6:
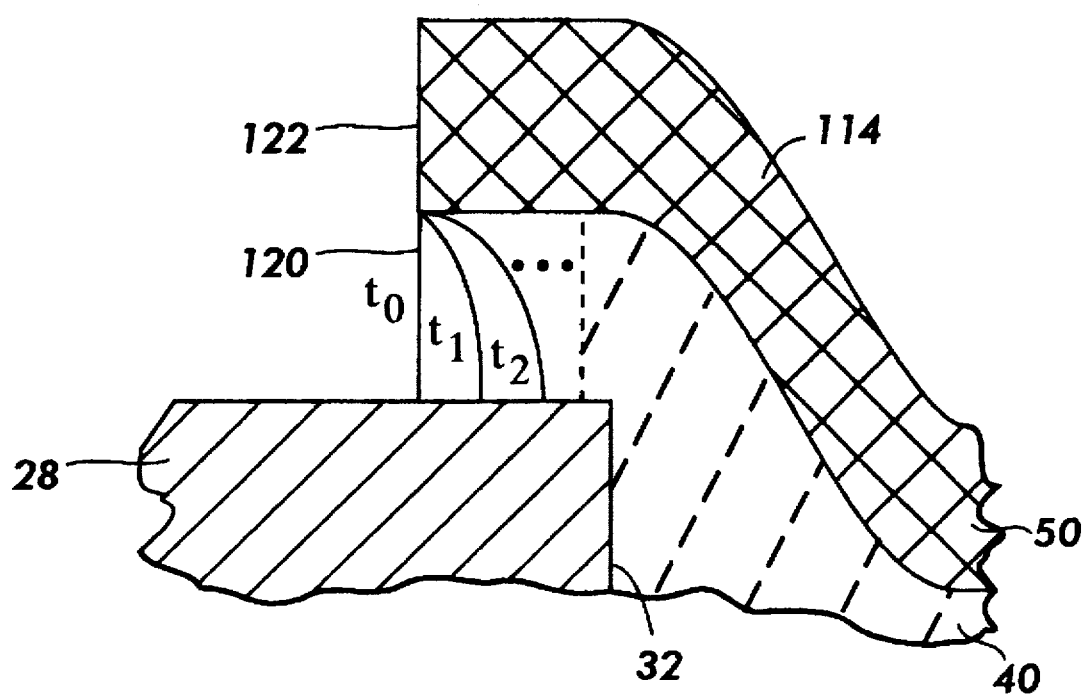
FIG. 6 is a schematic cross section showing how application of etchant can be timed to control the distance by which a conductive lead as in FIG. 1 overlaps an insulating region.

In FIG. 6, a slight overlap is produced by timing application of etchant to remove exposed parts of doped semiconductor layer 40. An anisotropic etchant can be used that quickly etches downward through parts of semiconductor layer 40 that are not covered by baked part 114 of resist layer 50, but that also etches to the side at a slower rate. Therefore, application of etchant can be timed to control overlap. At time $t_0$, overlap 64 extends to edge 120, approximately aligned with edge 122 of baked part 114. As the duration of etchant application increases to $t_1$ and $t_2$, however, the etchant reduces the size of overlap 64. Eventually, overlap 64 could be removed, but a duration of etchant application below that limit can produce an appropriate overlap distance.

The techniques illustrated in FIGS. 3–6 could be used separately or together to control overlap distance.

C. Implementation

The general features described above could be implemented in numerous ways to produce an amorphous silicon device with a fully self-aligned junction and a conductive lead that overlaps the insulating region by a distance not exceeding the maximum overlap distance. The implementation described below produces an active matrix array on an insulating substrate.

C.1. Fabrication

Figure 7:
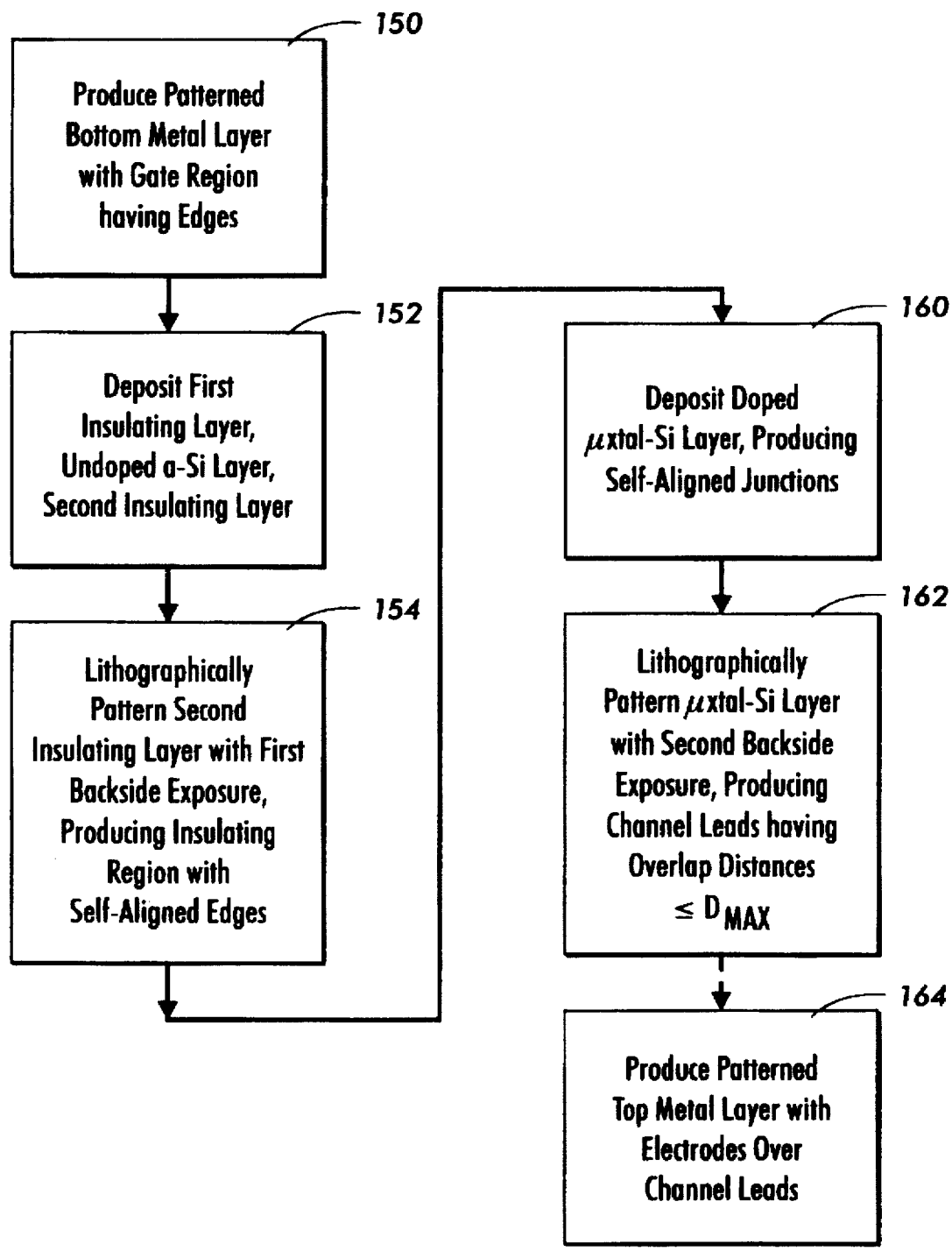
FIG. 7 is a flow chart showing acts in producing an active matrix array on an insulating substrate in one implementation of the general acts in FIG. 2.
Figure 8:
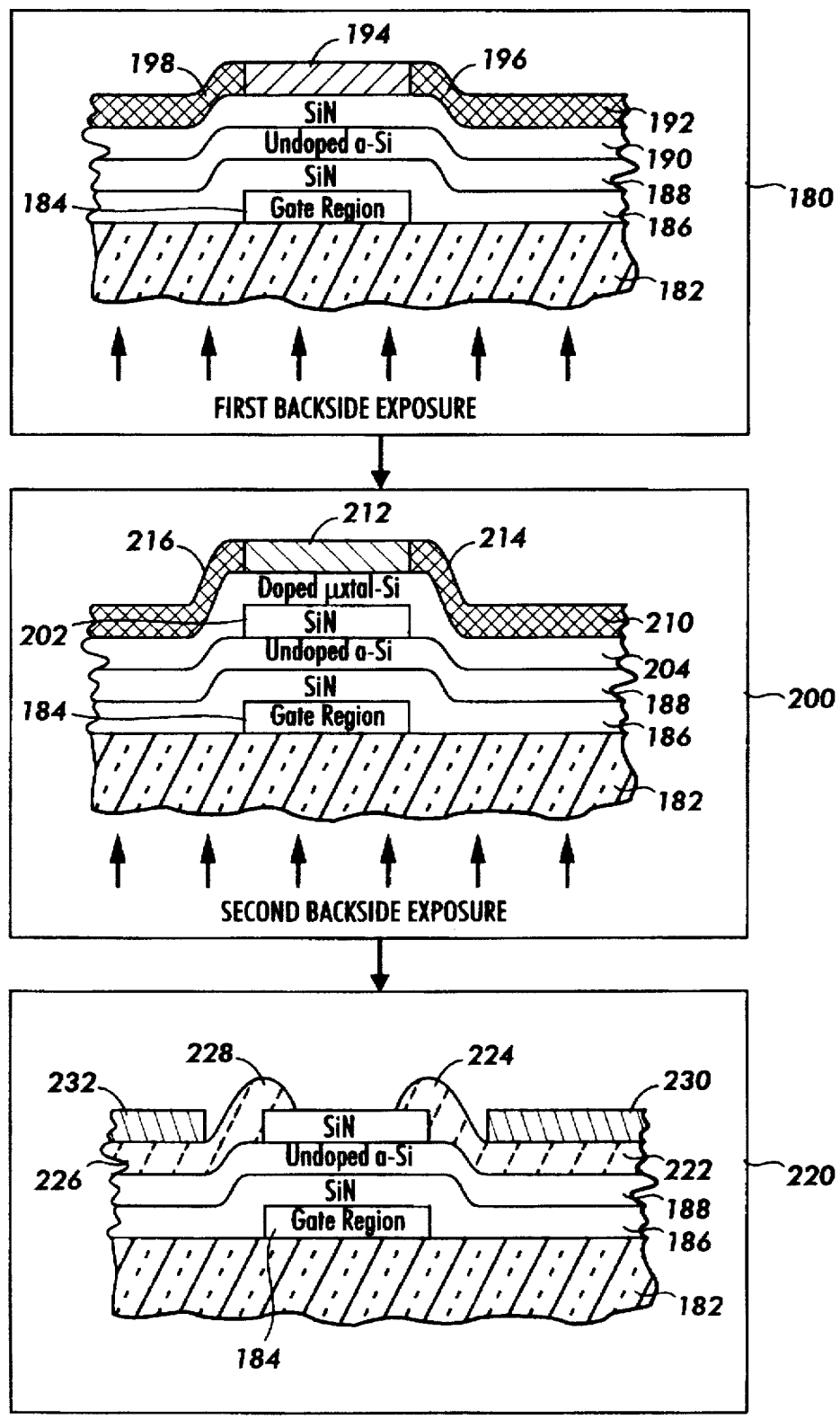
FIG. 8 is a schematic flow diagram with cross sections showing several stages in performing the acts in FIG. 7.

FIGS. 7 and 8 illustrate a fabrication technique that implements the general features described above. FIG. 7 shows acts in producing an active matrix array on an insulating substrate. FIG. 8 shows several stages in performing the acts in FIG. 7.

The act in box 150 in FIG. 7 begins by producing a bottom metal pattern that forms a scan line for each row of cells in an active matrix array and, for each cell, a gate lead that includes a gate region. The act in box 150 can be implemented by depositing metal using a physical vapor deposition process such as sputtering. The metal can be MoCr, TiW, Al, Al with a TiW capping layer, or another appropriate scan line metal, deposited to a thickness of 400–2000 angstroms. 1000 angstroms of MoCr, for example, is an appropriate metal as described in copending coassigned U.S. patent application Ser. No. 08/235,008, entitled "Thin-Film Structure with Conductive Molybdenum-Chromium Line," incorporated herein by reference. The metal can then be lithographically patterned. In current implementations, typically distances between gate region edges are approximately 10 μm, with distances of 5 μm and less being attainable in the near future.

The act in box 152 then produces a bottom nitride layer, an amorphous silicon layer, and a top nitride layer. The act in box 152 has been implemented with plasma chemical vapor deposition (CVD) using a trilayer deposition or etch stop process that deposited three layers in sequence without breaking vacuum. The bottom nitride layer can be silicon nitride deposited at 300°–380° C. to obtain a thickness of 3000 angstroms. The amorphous silicon layer can be deposited at 230°–300° C. with 5–12% hydrogen, with a thickness of 300–500 angstroms.

The top nitride layer can be silicon nitride deposited at 200°–250° C. to obtain a thickness of 1000–1500 angstroms.

The act in box 154 then lithographically patterns the top nitride with self-aligned backside exposure and top masked exposure of a positive photoresist. The backside exposure defines the self-aligned edges of an insulating region at which junctions will be formed, and the top masked exposure defines the other two edges of the insulating region. The act in box 154 can use a wet etch with a 10:1 buffered oxide etch such as 10 parts ammonium fluoride per part of HF for approximately 2.5 minutes or until the oxide is removed, as indicated by water sheeting off so that the surface is not wet when removed from the etchant, to obtain a self-aligned insulating region over the gate region. The act in box 154 can also include cleaning with a solution of 200 parts water per part of HF to remove native oxide; here again, the etch can continue until the oxide is removed as indicated by water sheeting off.

The acts in boxes 160 and 162 then produce a pattern of doped μxtal-Si, providing self-aligned channel leads that overlap the self-aligned insulating region by no more than a maximum overlap distance of 1.0 μm.

The act in box 160 deposits a layer of doped μxtal-Si to produce self-aligned junctions at the edges of the insulating region. Deposition of μxtal-Si can be implemented by first performing plasma CVD with $SiH_4$, $PH_3$, and $H_2$ at a high deposition power to deposit a heavily n+ doped μxtal-Si layer at 200°–250° C. with 5–15% hydrogen to a thickness of 500–1000 angstroms. The μxtal-Si layer should be thin enough to let light through, yet thick enough to be sufficiently conductive to function as a channel lead. The proportions of gases should be chosen to obtain an appropriate grain size and an appropriate level of dopant. The μxtal-Si layer can be doped, for example, with 0.5–2% phosphorous.

The act in box 160 could alternatively deposit poly-Si, which has adequate conductivity, or another highly conductive semiconductor material. A heavily n+ doped a-Si layer, however, would not be sufficiently conductive at this scale to carry current between the a-Si channel and subsequently formed metal electrodes without introducing a large series resistance—the metal is patterned to have an edge separated from the self-aligned edge of the insulating region by a sufficient alignment tolerance to avoid errors in which the metal overlaps the insulating region and causes additional capacitance.

The act in box 162 lithographically patterns the μxtal-Si layer by self-aligned backside exposure and top masked exposure of a conventional negative photoresist that behaves like a positive resist in process to avoid use of problematic developers such as phenol and xylene. The backside exposure defines the self-aligned edges of channel leads that will overlap the insulating region, and the top masked exposure defines the other edges of the channel leads. The act in box 162 can etch to remove the μxtal-Si layer over the insulating region, which acts as an etch stop, and to remove both the μxtal-Si layer and the a-Si layer elsewhere. During backside exposure, application of developer, baking, and application of etchant, the operator can observe the structure through a microscope and time each operation to obtain an overlap distance that does not exceed the maximum overlap distance. Appropriate times will depend on such factors as intensity of backside illumination, concentrations of developer and etchant, and temperature of baking. With standard illumination, for example, 60 sec of backside exposure can produce an overlap distance as large as 1 μm; in general, the overlap distance is proportional to the length of backside exposure.

An etch technique can be chosen that obtains the desired overlap distance. Reactive ion etching produces a vertical profile because it is highly anisotropic, rapidly etching downward and only slowly etching sideways, while chemical and barrel etching are isotropic and produce more undercut. Therefore, reactive ion etching can be more easily timed to control overlap.

The act in box 162 can also include another lithographic process that cuts vias through the bottom nitride layer in appropriate locations to allow electrical connections with the bottom metal pattern.

For uniform overlap distances, all the lithographic processes performed in box 162 must be performed uniformly over the array.

The act in box 164 produces a top metal pattern, including electrodes that are over the channel leads formed in box 162, for electrically connecting the junctions to other components such as a cell's circuitry and a data line. To prevent top metal from overlapping the insulating region, the electrodes are pulled back from the edge of the insulating region by at least 2 μm. The top metal can be the same as the bottom metal in box 150, and can have a thickness of 400–2000 angstroms.

The manner in which the array can be used to produce an active matrix LCD and further details of the technique in FIG. 7 can be understood from the description of FIG. 4 of copending coassigned U.S. patent application Ser. No. 08/235,011, now U.S. Pat. No. 5,491,347, entitled "Thin-Film Structure With Dense Array of Binary Control Units for Presenting Images" ("the Dense Array Application"), incorporated herein by reference. For example, as suggested by the dashed line from box 162 to box 164, additional acts could be performed after box 162 and before box 164. The act in box 164 can also be followed by conventional acts including passivation and so forth.

FIG. 8 shows stages in the implementation of FIG. 7.

Cross section 180 in FIG. 8 shows the first backside exposure, in box 154. As in the other stages, a structure is formed on a surface of substrate 182, with gate region 184 formed in box 150 and layers 186, 188, and 190 formed in box 152. Prior to the first backside exposure, the act in box 154 deposits positive photoresist layer 192. Part 194 of layer 192 is not photoexposed, but parts 196 and 198 are photoexposed.

Cross section 200 shows the second backside exposure, in box 162. The act in box 154 develops photoresist layer 192, removes part 194, and then etches away exposed parts of SiN layer 190, producing insulating region 202 with self-aligned edges. The act in box 160 then deposits doped μxtal-Si layer 204, producing self-aligned junctions at the edges of insulating region 202. Prior to the second backside exposure, the act in box 162 deposits negative photoresist layer 210. Part 212 of layer 210 is not photoexposed, but parts 214 and 216 are photoexposed.

Cross section 220 shows the structure after the act in box 164. The act in box 162 develops photoresist layer 210, removes parts 214 and 216, and then etches away exposed parts of μxtal-Si layer 204, producing channel lead 222 with overlap 224 and channel lead 226 with overlap 228. The lithographic patterning is performed in such a way that overlaps 224 and 228 do not exceed a maximum overlap distance. The act in box 164 then produces electrodes 230 and 232, parts of the top metal layer that are electrically connected to the self-aligned junctions through channel leads 222 and 226.

C.2. Array with a-Si TFTs

Figure 9:
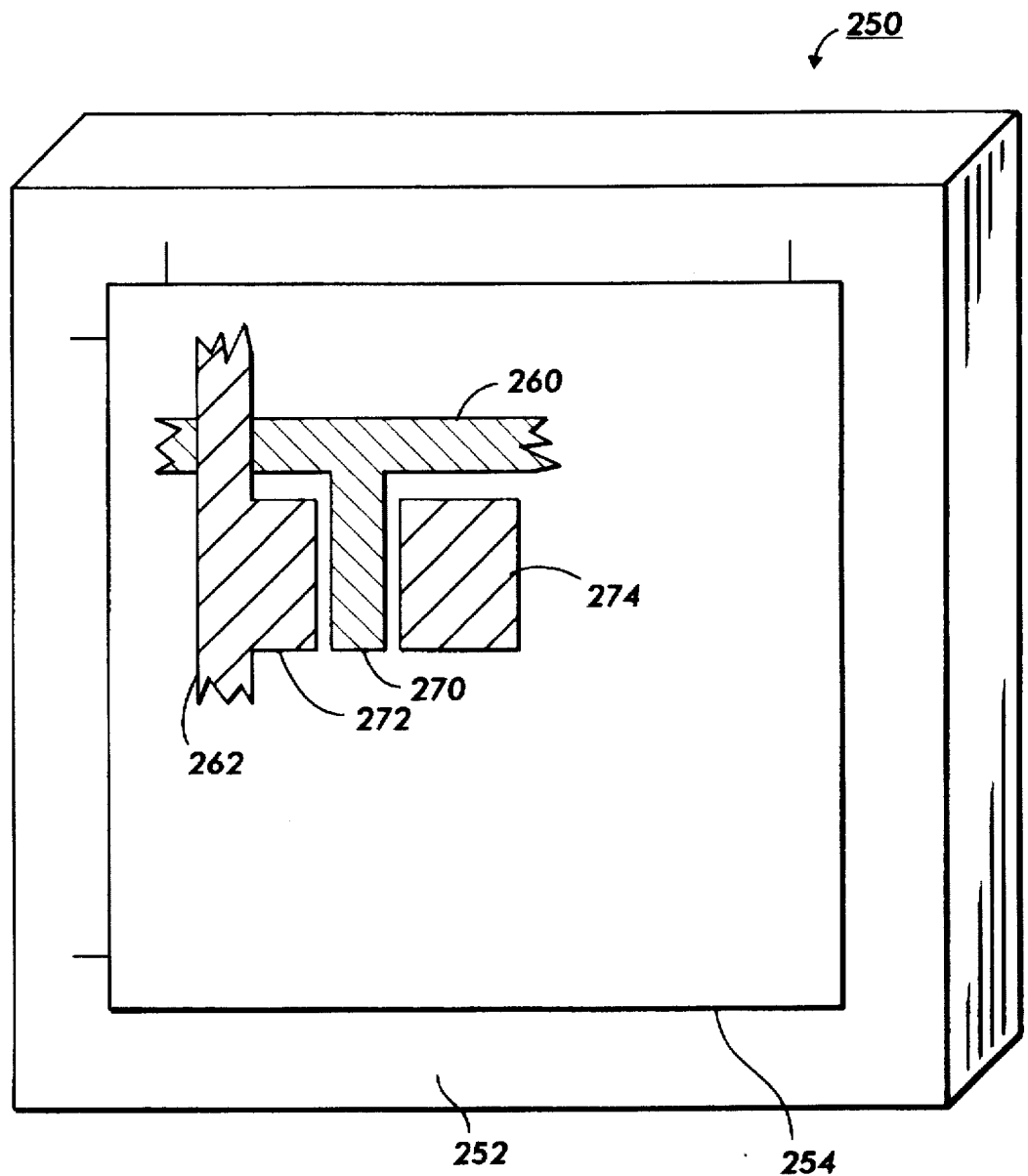
FIG. 9 is a schematic diagram showing an array product produced by the acts in FIG. 7 and showing layout of some layers in a cell in the array.

FIG. 9 shows array product 250, which could be produced with the techniques described above in relation to FIGS. 7 and 8.

Array product 250 includes substrate 252 with array region 254 in which scan lines extend left to right and data lines extend top to bottom, so that each scan line crosses each data line. FIG. 9 also shows a layout of the top and bottom metal layers in the area where a representative scan line 260 crosses a representative data line 262.

The bottom metal layer includes scan line 260 and also gate region 270. Gate region 270 can have an appropriate width for the device being fabricated-its width determines the length of the channel of the a-Si TFT formed over it.

The top metal layer includes data line 262 and also channel electrodes 272 and 274. Data line 262 can have the same width as scan line 260, but channel electrodes 272 and 274 can have a width larger or greater than the width of the channel of the a-Si TFT, which must be sufficient to meet the current requirement of the device being fabricated. In addition, the spacing from channel electrode 272 to the edge of gate region 270 and the spacing from channel electrode 274 to the edge of gate region 270 can each be 2 μm to avoid errors in which channel electrodes 272 and 274 extend over the insulating region, increasing capacitance. These dimensions are merely illustrative, of course; in practice, the TFT will be dimensioned to provide the necessary current for proper device operation.

As can be understood from FIG. 9, the a-Si TFT connects data line 262 to a cell's circuitry (not shown) under control of gate line 260. When the a-Si TFT is ON due to a signal on gate line 260, the channel of the a-Si TFT provides an electrical connection between channel electrodes 272 and 274. Channel electrode 272 in turn is electrically connected to data line 262, and channel electrode 274 is electrically connected to the cell's circuitry.

An example of cell circuitry that could be used in an active matrix liquid crystal display (AMLCD) is described in relation to FIG. 3 of the Dense Array Application.

C.3. Test Results

Figure 10:
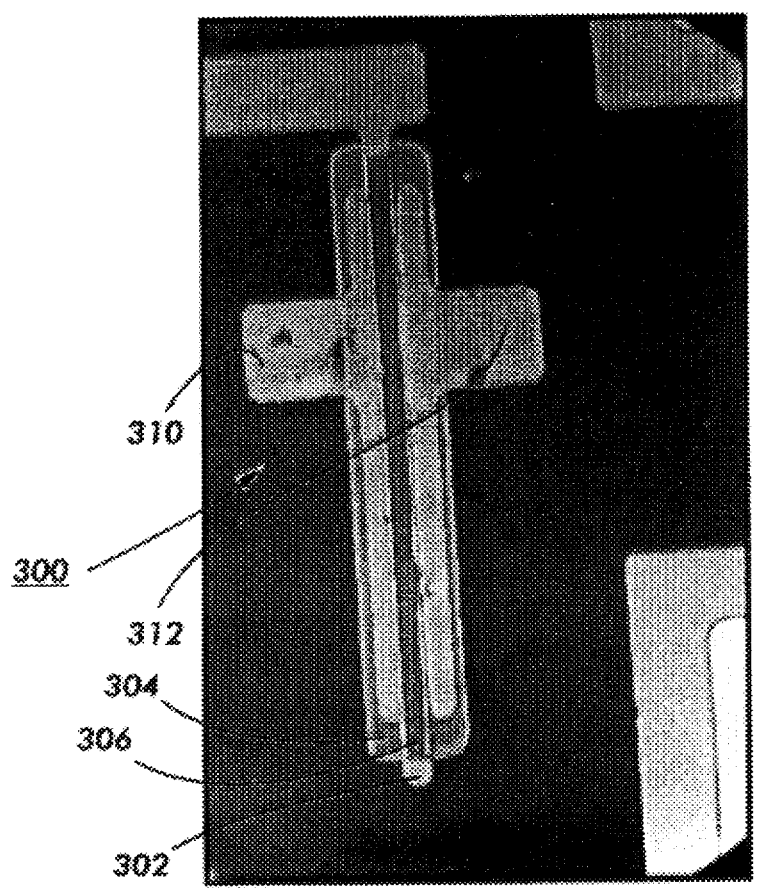
FIG. 10 is a microscopic photograph showing a structure produced by implementing the general acts in FIG. 2.
Figure 11:
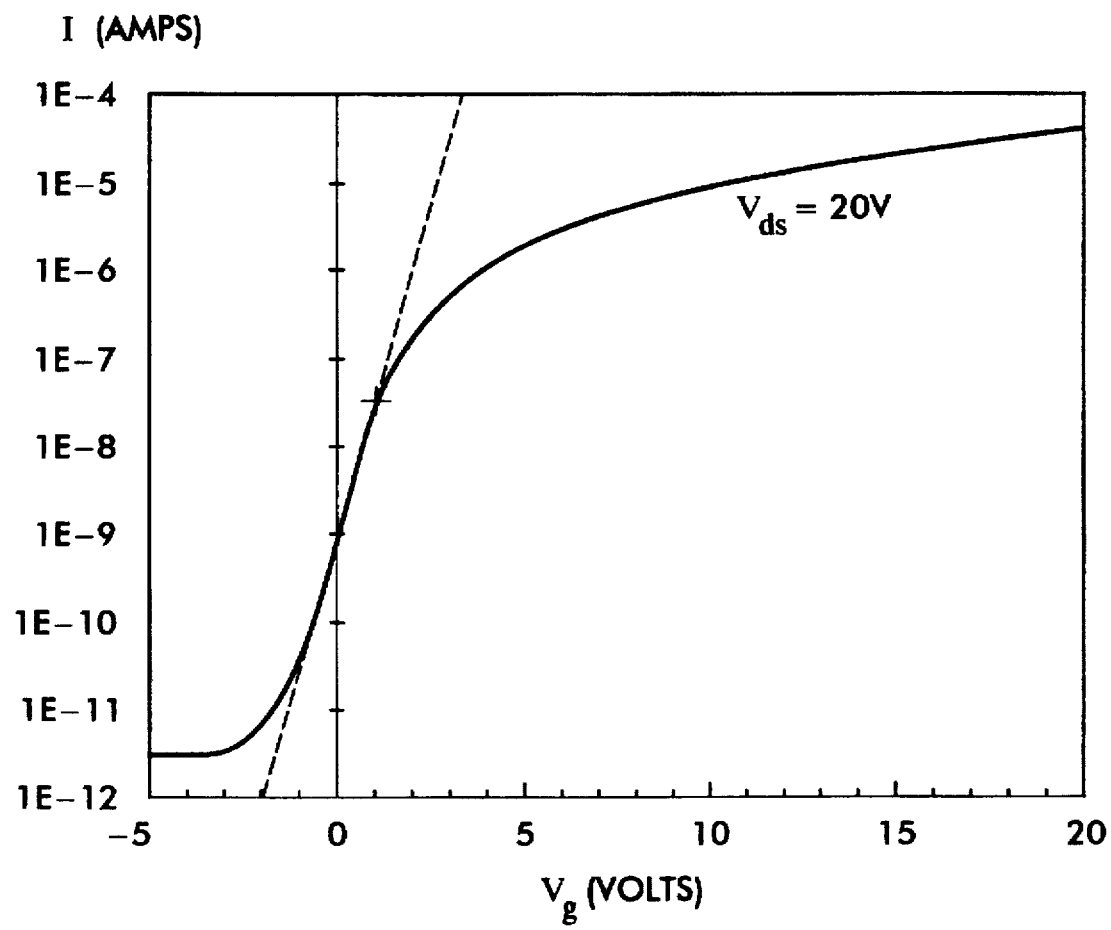
FIG. 11 is a graph showing current-voltage characteristics of a structure like that in FIG. 10.

An implementation of the general features described above has been built and tested. FIG. 10 shows a structure produced by implementing the general acts in FIG. 2. FIG. 11 shows current-voltage characteristics of a structure like that in FIG. 10.

The microscopic photograph in FIG. 10 shows device 300 successfully produced by implementing the general acts in FIG. 2, using a fabrication process similar to that described above in relation to FIGS. 7 and 8. Line 302 is a long, narrow line formed in a bottom metal layer and covered by layers 304, an undoped a-Si layer covered by a PECVD layer of doped μxtal-Si. The pattern of doped μxtal-Si is formed using backside exposure to obtain self-aligned edges that overlap the self-aligned edges of insulating region 306.

The area in which layers 304 cover line 302 defines a gate region of line 302 and a gated region of the undoped a-Si layer, each with dimensions approximately 98 μm×5 μm. Over the gated region of the undoped a-Si layer is insulating region 306, formed in a layer of SiN using backside exposure to obtain self-aligned edges. As can be seen from FIG. 10, the PECVD layer of doped μxtal-Si overlaps insulating region 306 by distances that are generally less than 0.5 μm and that are less than 1.0 μm along the entire length of insulating region 306. The overlap distances were obtained by microscopically examining the device during etching, judging visually when an appropriate overlap distance had been obtained. This suggests that more precise fabrication techniques will allow smaller values for $D_{MAX}$, such as 0.5 μm.

The overlap shown in FIG. 10 is sufficient to provide a tolerance that prevents etching of the undoped a-Si layer for devices in an array, yet is small enough to avoid shorts across insulating region 306 and to minimize capacitance. If there were no overlap, extremely slight alignment errors across an array of devices would lead to defects due to etching of undoped a-Si at a junction.

Channel electrodes 310 and 312 are formed in a top metal layer to permit electrical connections so that device 300 can be tested. A similar device has measured mobility of 0.59 $cm^2$/V-sec. The device's current-voltage performance is shown in FIG. 12, which shows that the device exhibited low OFF current and high ON current at a drain-source voltage of 20V.

C.4. Variations

The implementation described above could be changed in many ways within the scope of the invention.

The above implementation uses particular materials in a thin-film structure, but other materials could be used. For example, different metals could be used in the bottom and top metal layers, or other conductive materials could be used rather than metal, such as a thick layer of heavily doped silicon provided it is thick enough to prevent photoexposure of resist. Different insulating materials could be used. The channel leads could be formed from a different doped semiconductor material, provided it is sufficiently conductive.

The above implementation uses particular processes to produce a thin-film structure, but other processes could be used. In some cases, for example, acts could be performed in a different order or with different materials. Various resists, developers, and etchants could be used.

The above implementation uses a layout for a cell in an array, but other layouts could be used.

The implementation described above provides circuitry with specific geometric and electric characteristics, but the invention could be implemented with different geometries and with different circuitry.

The implementation described above includes layers of specified thicknesses, produced from specified materials by specified processes, but other thicknesses could be produced, and other materials and processes could be used, such as thinner semiconductor and insulating layers to improve TFT performance or to increase storage capacitance.

The implementation described above includes layers in a specific sequence, but the sequence of layers could be modified.

D. Application

The invention can be used to produce an array as described in copending, coassigned U.S. patent application Ser. No. 08/BBB,BBB (Attorney Docket No. D/95563Q), entitled "Array With Fully Self-Aligned Amorphous Silicon TFTs," incorporated herein by reference.

The invention could be applied in many ways, including not only production of active matrix arrays but also production of other structures in which very small a-Si TFTs are beneficial. The invention can be applied in active matrix arrays of many different kinds, including display arrays, light valve arrays, and sensor arrays.

E. Miscellaneous

The invention has been described in relation to thin-film implementations, but the invention might be implemented with single crystal technology.

Although the invention has been described in relation to various implementations, together with modifications, variations, and extensions thereof, other implementations, modifications, variations, and extensions are within the scope of the invention. The invention is therefore not limited by the description contained herein or by the drawings, but only by the claims.

What is claimed:

1. An improved method of forming an amorphous silicon thin film transistor at a surface of a substrate; the amorphous silicon thin film transistor including:

a gate region that has first and second edges;

an undoped amorphous silicon layer over the gate region; the undoped amorphous silicon layer extending beyond the first and second edges of the gate region; and an insulating region over the amorphous silicon layer; the insulating region having first and second edges approximately aligned with the first and second edges of the gate region so that the amorphous silicon layer has exposed parts outside the first and second edges of the insulating region;

the improved method comprising:

depositing a PECVD layer of doped semiconductor material over the insulating region and over the exposed parts of the amorphous silicon layer, the act of depositing the PECVD layer of doped semiconductor material producing first and second junctions between the doped semiconductor layer and the exposed parts of the amorphous silicon layer at the first and second edges of the insulating region, respectively; the first and second junctions being approximately aligned with the first and second edges of the gate region, respectively; and patterning the doped semiconductor layer using self-aligned lithography to produce first and second channel leads that extend from the first and second junctions, respectively; the act of patterning the doped semiconductor layer being performed in such a way that the first and second channel leads have first and second self-aligned edges, respectively, approximately aligned with the first and second edges of the gate region, respectively; each of the first and second self-aligned edges overlapping the insulating region by a distance that is no more than a maximum overlap distance.

2. The method of claim 1 in which the act of patterning the doped semiconductor layer comprises:

depositing a photoresist layer over the doped semiconductor layer;

performing backside exposure to photoexpose the photoresist layer; the gate region preventing photoexposure of parts of the photoresist layer that are over the gate region; and removing parts of the photoresist layer that are not photoexposed to expose parts of the doped semiconductor layer under the removed parts of the photoresist layer; and removing parts of the doped semiconductor layer that are exposed by the act of removing parts of the photoresist layer.

3. The method of claim 2 in which the act of performing backside exposure comprises:

timing backside exposure to control a distance by which photoexposed parts of the photoresist layer overlap the insulating region.

4. The method of claim 2 in which the act of removing parts of the photoresist layer comprises:

applying a developer; the act of applying a developer comprising timing application of the developer to control a distance by which parts of the photoresist layer that are not removed overlap the insulating region.

5. The method of claim 4 in which the act of removing parts of the photoresist layer further comprises:

baking the parts of the photoresist layer that are not removed by the developer; the act of baking comprising timing baking to control a distance by which baked parts of the photoresist layer overlap the insulating region.

6. The method of claim 2 in which the act of removing parts of the doped semiconductor layer comprises:

applying an etchant that removes parts of the doped semiconductor layer that are exposed; the act of applying an etchant comprising timing application of the etchant to control a distance by which parts of the doped semiconductor layer that are not removed by the etchant overlap the insulating region.

7. The method of claim 1 in which the doped semiconductor layer is a PECVD layer of microcrystalline silicon.

8. The method of claim 1 in which the doped semiconductor layer is a PECVD layer of polycrystalline silicon.

9. The method of claim 1 in which the maximum overlap distance is no more than 1.0 µm.

10. The method of claim 9 in which the maximum overlap distance is 0.5 µm.

11. A method of forming circuitry at a surface of a substrate; the method comprising:

producing a patterned conductive layer that includes a gate region, the gate region having an edge;

depositing a first insulating layer over the gate region;

depositing an undoped amorphous silicon layer over the first insulating layer;

depositing a second insulating layer over the amorphous silicon layer;

patterning the second insulating layer using self-aligned lithography to form an insulating region; the act of patterning the second insulating layer comprising:

performing a first backside exposure to photoexpose a first photoresist layer; the gate region preventing photoexposure of parts of the first photoresist layer that are over the gate region;

removing photoexposed parts of the first photoresist layer to expose parts of the second insulating layer; and removing parts of the second insulating layer that are exposed so that the insulating region has an edge approximately aligned with the edge of the gate region and so that the amorphous silicon layer is exposed where the second insulating layer is removed;

depositing a PECVD layer of doped microcrystalline silicon over the insulating region and over exposed parts of the amorphous silicon layer, the act of depositing a PECVD layer of doped microcrystalline silicon producing a junction between the microcrystalline silicon layer and the amorphous silicon layer at the edge of the insulating region; the junction being approximately aligned with the edge of the gate region; and patterning the doped microcrystalline silicon layer using self-aligned lithography to produce a conductive lead extending from the junction; the act of patterning the microcrystalline silicon layer comprising:

performing a second backside exposure to photoexpose a second photoresist layer; the gate region preventing photoexposure of parts of the photoresist layer that are over the gate region; and removing parts of the second photoresist layer that are not photoexposed to expose parts of the microcrystalline silicon layer under the removed parts of the second photoresist layer; and removing parts of the microcrystalline silicon layer that are exposed by the act of removing parts of the second photoresist layer;

the act of patterning the microcrystalline silicon layer being performed in such a way that the conductive lead has a self-aligned edge approximately aligned with the edge of the gate region; the self-aligned edge overlapping the insulating region by a distance that is no more than a maximum overlap distance.

12. The method of claim 11 in which the second photoresist layer is a layer of material that functions as a negative resist.

13. The method of claim 11 in which the act of performing a second backside exposure comprises:

timing the second backside exposure to control a distance by which photoexposed parts of the second photoresist layer overlap the insulating region.

14. The method of claim 11 in which the act of removing parts of the second photoresist layer comprises:

applying a developer; the act of applying a developer comprising timing application of the developer to control a distance by which parts of the second photoresist layer that are not removed overlap the insulating region.

15. The method of claim 14 in which the act of removing parts of the second photoresist layer further comprises:

baking the parts of the second photoresist layer that are not removed by the developer; the act of baking comprising timing baking to control a distance by which baked parts of the second photoresist layer overlap the insulating region.

16. The method of claim 11 in which the act of removing parts of the microcrystalline silicon layer comprises:

applying an etchant that removes parts of the microcrystalline silicon layer that are exposed; the act of applying an etchant comprising timing application of the etchant to control a distance by which parts of the microcrystalline silicon layer that are not removed by the etchant overlap the insulating region.

17. The method of claim 11 in which the maximum overlap distance is no more than 1.0 μm.

18. The method of claim 11 in which the maximum overlap distance is 0.5 μm.

19. The method of claim 11, further comprising:

producing a patterned metal layer that includes a conductive metal electrode over the conductive lead; the conductive electrode being electrically connected to the junction through the conductive lead.

* * * * *